United States Patent [19]

Nakada et al.

[11] 4,112,361
[45] Sep. 5, 1978

[54] LIQUID CRYSTAL APPLIED VOLTMETER

[75] Inventors: Takashi Nakada; Toshiharu Takoh, both of Tokyo, Japan

[73] Assignee: Tokyo Seimitsu Co. Ltd., Japan

[21] Appl. No.: 691,664

[22] Filed: Jun. 1, 1976

[30] Foreign Application Priority Data

Jun. 5, 1975 [JP] Japan .................. 50-67857
Feb. 20, 1976 [JP] Japan .................. 51-017786
Mar. 11, 1976 [JP] Japan .................. 51-026564

[51] Int. Cl.² ........................................ G02F 1/13
[52] U.S. Cl. ............................ 324/92; 324/96; 350/336; 350/347
[58] Field of Search ............ 324/96, 92; 350/160 LC, 350/150; 250/213 R; 340/173 LS, 173 LT

[56] References Cited

U.S. PATENT DOCUMENTS

| | | | |
|---|---|---|---|
| 2,942,131 | 6/1960 | Diemer et al. | 250/213 R |
| 3,604,938 | 9/1971 | Kohashi et al. | 250/213 R |
| 3,667,039 | 5/1972 | Garfein et al. | 324/96 X |
| 3,675,988 | 7/1972 | Soref | 350/160 LC |
| 3,732,429 | 5/1973 | Braunstein et al. | 350/160 LC X |
| 3,756,694 | 9/1973 | Soref et al. | 350/160 LC |

OTHER PUBLICATIONS

Ludeman et al., Liquid Crystal Cell Having Nonuniform Thickness, IBM Technical Discl. Bulletin, Sep. 1972, pp. 1349, 1350.

*Primary Examiner*—Edward S. Bauer
*Attorney, Agent, or Firm*—William Anthony Drucker

[57] ABSTRACT

A liquid crystal applied voltmeter in which a nematic liquid crystal is filled between a pair of light transmitting electrodes at both sides of which polaroidal plates are provided and at least one of the light transmitting electrodes comprises an electric resistance film to which a constant voltage power supply is connected so that a voltage gradient occurs across both ends of the electric resistance film wherein a border between the light transmitting part and the non-light transmitting part of the liquid crystal moves in response to variation of the measured voltage when the measured voltage is applied across both the electrodes.

4 Claims, 17 Drawing Figures

LIQUID CRYSTAL APPLIED VOLTMETER

BACKGROUND OF THE INVENTION

The present invention relates to a liquid crystal applied voltmeter which indicates the voltage as an analogue term.

Conventionally, a moving coil type voltmeter has been known as this type of display voltmeter. However, the moving coil type voltmeter is disadvantageous in that its vibration resistance is small since the coil and the needle are rotatably supported and the needle swings to indicate an erroneous reading due to external mechanical vibration, while the response will be contrarily deteriorated even when such mechanical properties are improved. Moreover, a decrementally graduated scale of which the scale was graduated in accordance with logarithmic functions has been applied for indicating, for example, the decibel values of the logarithmic functions by the moving coil type voltmeter and in some cases, therefore, the reading of the scale has been extremely difficult, depending on a range of measured value.

The first object of the present invention is to provide a voltmeter with excellent mechanical properties and response, and handsome appearance.

The second object of the present invention is to provide a functional voltmeter which is adapted to indicate the functional values of voltages such as the decibel values of voltages, that is, the logarithmic functions of voltages by an equally graduated scale, thus facilitating reading of the functional values of voltages.

SUMMARY OF THE INVENTION

The voltmeter of the present invention comprises a pair of polaroidal plates which are arranged in parallel, a pair of light transmitting electrodes, at least one of which comprising an electric resistance film, which are provided in parallel with a specified distance between both the polaroidal plates, a nematic liquid crystal such as, for example, MBBA liquid crystal providing the DAP effect which is filled between said both electrodes and a constant voltage power supply which is connected in parallel to the electric resistance film so that the voltage gradient occurs from one end to the other end of said electric resistance film.

A measured voltage is applied, for example, across both the electrodes. Since the voltage applied to the liquid crystal, that is, the voltage across the electrodes varies at the specified rate along the direction from one end to the other end of the electric resistance film, the position $X_o$ moves at which the voltage across the electrodes is equal to threshold voltage $E_t$ of the liquid crystal in response to variation of the measured voltage. The position $X_o$ divides the transmissive and non-transmissive parts of the liquid crystal and the value of the measured voltage may be known by reading the position $X_o$.

BRIEF DESCRIPTION OF THE DRAWINGS

The present invention is illustrated in detail by the accompanying drawings whereof.

DETAILED DESCRIPTION OF THE INVENTION

Figure 1:
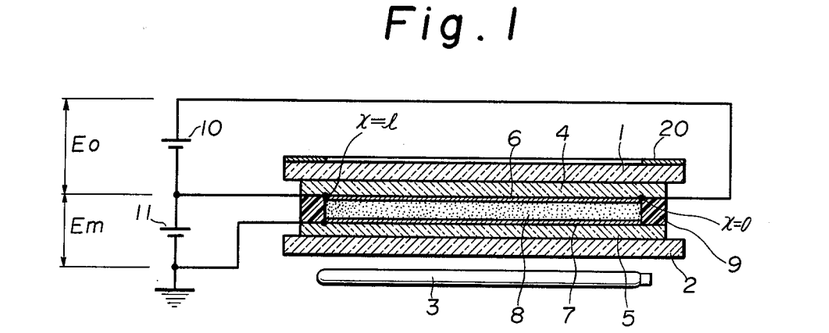
FIG. 1 is a cross sectional view showing the most fundamental embodiment of the present invention.
Figure 2:
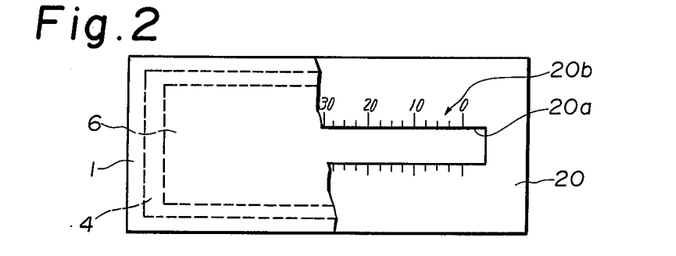
FIG. 2 is a partly cutaway view of the embodiment shown in FIG. 1.

Referring to FIGS. 1 and 2, there is shown the most fundamental embodiment of the voltmeter in accordance with the present invention.

A pair of polaroidal plates 1 and 2 which are provided in parallel with a specified distance between them are arranged so that the polarizing directions of the polaroidal plates intersects at a right angle. The light source 3 which irradiates the light to the polaroidal plate 2 is provided under the polaroidal plate 2. Two transparent plates 4 and 5 are provided in parallel between the polaroidal plates 1 and 2. The electrode 6 comprising a semi-transparent electric resistance film made of tin oxide is formed by such a means as evaporation on the lower surface of the transparent plate 4 at the upper side in FIG. 2 while the electrode 7 comprising the semi-transparent conductive film made of a conductive material similar to a complete conductor such as silver is formed by such a means as evaporation on the upper surface of the transparent plate 5 at the lower side. In this embodiment, the thickness and width of both electrodes 6 and 7 are set so that the thickness and width are fixed from the right end to the left end of the electrodes.

The space between the electrodes 6 and 7 is filled with the nematic liquid crystal in which the permanent dipole moment is directed at a right angle to the longer axis of the molecule, that is, the nematic liquid crystal 8 which provides the DAP effect such as, for example, the MBBA liquid crystal, and this liquid crystal 8 is enclosed in the insulating spacers 9 which are provided at the end parts of the electrodes 6 and 7. In addition to the liquid crystal 8 which provides the DAP effect, the liquid crystal which gives the TN effect can be used. However, the threshold voltage by virtue of the DAP effect appears more clearly than that by virtue of the TN effect and the DAP effect is therefore utilized in this embodiment.

The constant voltage DC power supply 10 is connected in parallel with the both ends of electrode 6. This power supply generates the constant voltage $E_o$. Since the electrode 6 is made of the electric resistance film, the negative voltage gradient occurs from the right end to the left end of the electrode 6. The positive side terminal of the measured voltage source 11 is connected to the left end, that is, the negative side terminal of the electrode 6 and the negative side terminal of the measured voltage source 11 is connected to the left side of the electrode 7 comprising a conductor film. The left end of the electrode 7 is grounded. For simplification of the description in this embodiment, the measured voltage $Em$ from the measured voltage source 11 is to be the DC voltage but, in actual practice, it is possible to measure the AC voltage. However, if the measured voltage $Em$ is the AC voltage, the AC voltage which has a fixed root mean square value (r.m.s. value) and is in phase with the measured voltage should be used as the constant voltage $E_o$. Moreover, the scale plate 20 provided with window 20a at its center is stacked on the upper surface of the polaroidal plate 1. This scale plate is provided with the scale 20b which is graduated with equal distance from the right side specified position to the left.

Assume that the X coordinate axis is plotted in the longitudinal direction of electrode 6, the right extreme end position of the electrode 6 is $X = 0$ and the left extreme position is $X = l$. The value of resistance per unit length of the electrode 6 is fixed from the position of $X = 0$ to the position of $X = l$. If the measured voltage is $Em = 0$, the voltage applied across the electrodes 6 and 7, that is, the voltage E applied to the liquid crystal 8 is given by the following equation (1) with respect to the coordinate point X.

$$E = E_o(1 - \frac{X}{l}) \tag{1}$$

Figure 3:
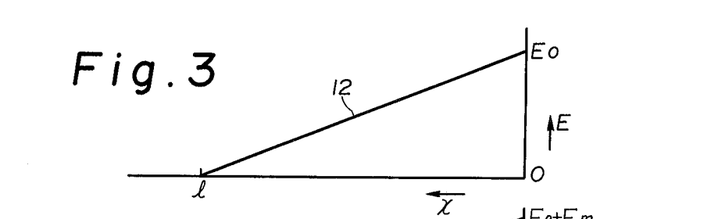
FIG. 3 is a view showing the distribution of voltage across the electrodes while the measured voltage is not applied in the embodiment shown in FIG. 1.

It is known from the equation (1) that the voltage E linearly varies in reference to the position X at the gradient of $E_o/l$ as shown by line 12 in FIG. 3.

Figure 4:
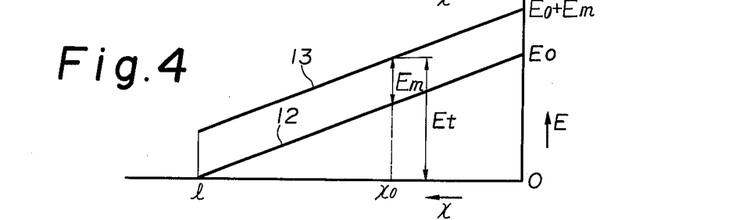
FIG. 4 is a view showing the distribution of voltage across the electrodes while the measured voltage is applied in the embodiment shown in FIG. 1.

Under the condition that the measured voltage $Em$ is applied, the voltage E is given by the following equation (2).

$$E = E_o(1 - \frac{X}{l}) + Em \tag{2}$$

Figure 5:
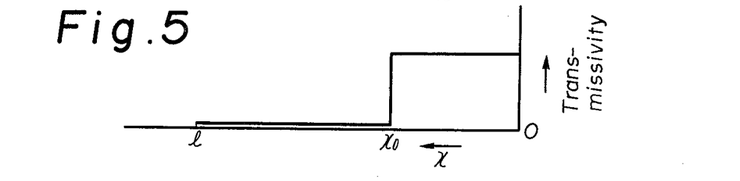
FIG. 5 is a graph indicating the variation of transmissivity of the liquid crystal, depending on the position.

It is known from the equation (2) that the voltage E varies at the linear gradient along line 13 in FIG. 4 which is obtained by shifting up the line 12 as much as the measured voltage $Em$. If the threshold voltage with which the molecular arrangement of the liquid crystal 8 varies is $Et$ and the coordinate of the X axis at which the voltage E is equal to $Et$ is $X_o$, the molecular arrangement of the liquid crystal 8 in the region in the left side of coordinate point $X_o$ does not vary since the voltage applied to the liquid crystal is smaller than $Et$ in such region and the light L with the specified polarizing angle which passes through the polaroidal plate 2 passes through the liquid crystal 8 and interrupted by the polaroidal plate 1 whereby the polaroidal plate 1 is dark as viewed from above. On the other hand, since the voltage applied to the liquid crystal is larger than $Et$ in the region in the right side of coordinate point $X_o$, the molecular arrangement of the liquid crystal in this region is changed and therefore the light L is further polarized in the liquid crystal 8 and has the polarizing angle equal to that of the polaroidal plate 1 whereby the polaroidal plate 1 is brighter as viewed from above since the light L passes through the polaroidal plate 1. In other words, the coordinate $X_o$ is a border between the bright region A and the dark region B as shown in FIG. 5.

The following equation (3) is obtained by substituting $X = X_o$ and $E = Et$ in the equation (2).

$$Et = E_o(1 - \frac{X_o}{l}) + Em \tag{3}$$

The following equation (4) is obtained from the equation (3).

$$X_o = l(1 - \frac{Et}{E_o}) + \frac{l}{E_o} \cdot Em \tag{4}$$

where $Eo$, $Et$ and $l$ are fixed and $X_o$ varies in proportion to the measured voltage $Em$. The coordinate position $X_o$ which divides the bright part and the dark part shifts to the left in proportion to the increase of the measured voltage $Em$ and to the right in proportion to the decrease of the measured voltage $Em$. When the values of voltages are graduated on the scale with the interval of $l/E_o$ in reference to the position of $l(1 - Et/E_o) = $ fixed, the value of the measured voltage can be recognized by reading the scale indication corresponding to the position dividing the bright part and the dark part. For example, when the constant voltage $E_o$ is set to be equal to the threshold voltage $Et$, the measured voltage can be graduated equally in reference to the position of $X = 0$ as $Em = 0$.

Figure 6:
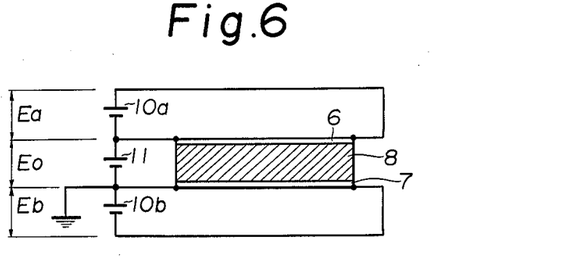
FIG. 6 is an explanatory electric connection diagram of the embodiment in which both the electrodes comprise the electric resistance film.
Figure 7:
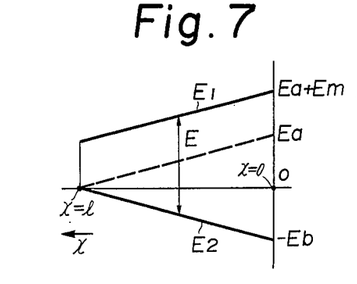
FIG. 7 is a view showing the distribution of voltage across the electrodes in the embodiment shown in FIG. 6.

Referring to FIG. 6, there is shown the second embodiment of the present invention. The electrodes 6 and 7 between which the liquid crystal 8 is filled comprise the electric resistance film respectively. The first constant voltage $Ea$ is applied across both ends of the electrode 6 from the first constant voltage power supply 10a and the second constant voltage $Eb$ is applied across both ends of the electrode 7 by the second constant voltage power supply 10b. The positive side end of the measured voltage power supply 11 is connected to the negative side end of the electrode 6 and the negative side end of the measured voltage power supply is connected to the positive side end of the electrode 7. The positive side terminal of the electrode 7 is grounded.

If the extreme right end positions of the electrodes 6 and 7 are $X = 0$ and the extreme left end positions are $X = l$, the potential E1 of the electrode 6 is given by the following equation with respect to the coordinate X.

$$E1 = Ea(1 - X/l) = Em \tag{5}$$

The voltage E2 of the electrode 7 is given by the following equation with respect to the coordinate X.

$$E2 = -Eb(1 - X/l) \qquad (6)$$

Accordingly, the voltage E applied to the liquid crystal 8 is given by the following equation with respect to coordinate X.

$$E = E1 - E2 = Ea + Eb - \frac{Ea + Eb}{l} X + Em \qquad (7)$$

The following equation is given at coordinate position $X_o$ at which the voltage E is equal to the threshold voltage $Et$.

$$Et = Ea + Eb - \frac{Ea + Eb}{l} X_o + Em \qquad (8)$$

accordingly, $$X_o = \frac{l(Ea + Eb - Et)}{Ea + Eb} + \frac{l}{Ea + Eb} \cdot Em \qquad (9)$$

From the above equation, it is known that the position $X_o$ which divides the bright part and the dark part varies in proportion to the measured voltage. In other words, the voltmeter can be used as the equally graduated voltmeter likewise the embodiment shown in FIG. 1.

The following equation (10) is given by substituting $Et = Ea + Eb$ in the equation (9).

$$X_o = \frac{l}{Et} \cdot Em \qquad (10)$$

Accordingly, the coordinate position $X_o$ which divides the bright part and the dark part is completely proportional to variation of the measured voltage $Em$ in reference to the position of $X = 0$.

Figure 8:
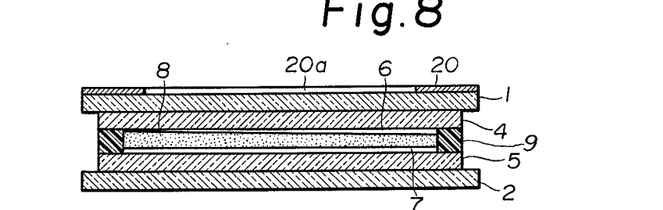
FIG. 8 is a sectional view showing the embodiment which is set so that the thickness of the electric resistance film varies.
Figure 9:
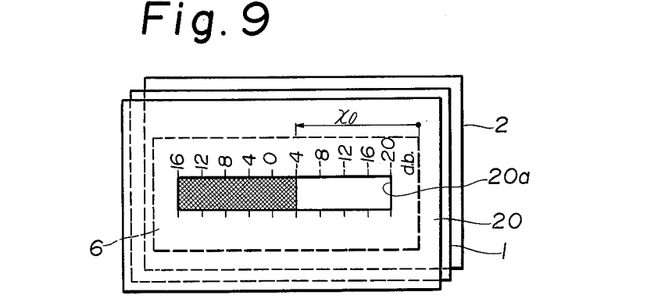
FIG. 9 is a plan view of the embodiment shown in FIG. 8.
Figure 10:
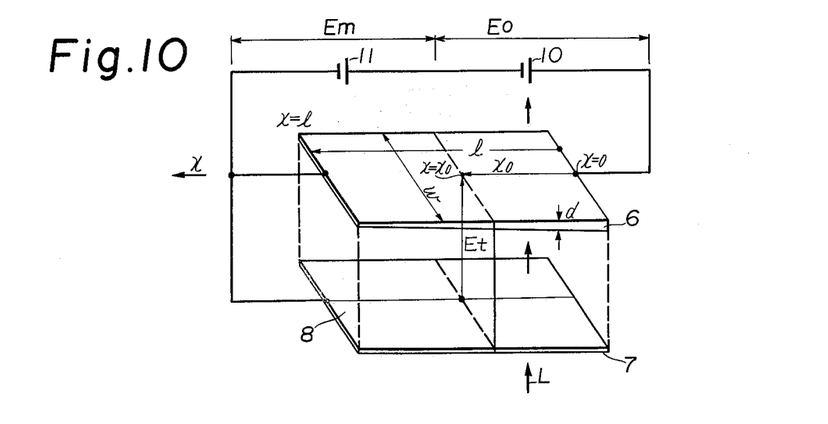
FIG. 10 is a diagram showing an example of electrical connection in the embodiment shown in FIG. 8.

Referring to FIGS. 8 to 10, there is shown the embodiment for measuring the functional values such as, for example, the logarithmic values of the measured voltages. In this embodiment, the same numbers are given to the same elements as in FIGS. 1 and 2.

Of the electrodes 6 and 7 between which the liquid crystal 8 is filled, the electrode 6 comprising the electric resistance film is set so that the thickness $d$ in the direction at a right angle to the coordinate axis varies in accordance with the specified function $f(X)$ of X or the thickness of $d = f(X)$ is obtained when the coordinate X along the surface of the electrode is plotted at the left side in the figure in reference to the right extreme end as the zero point. As described later, this function $f(x)$ is set corresponding to the functional voltage which should be indicated by the equally graduated scale.

Figures 12, 13:
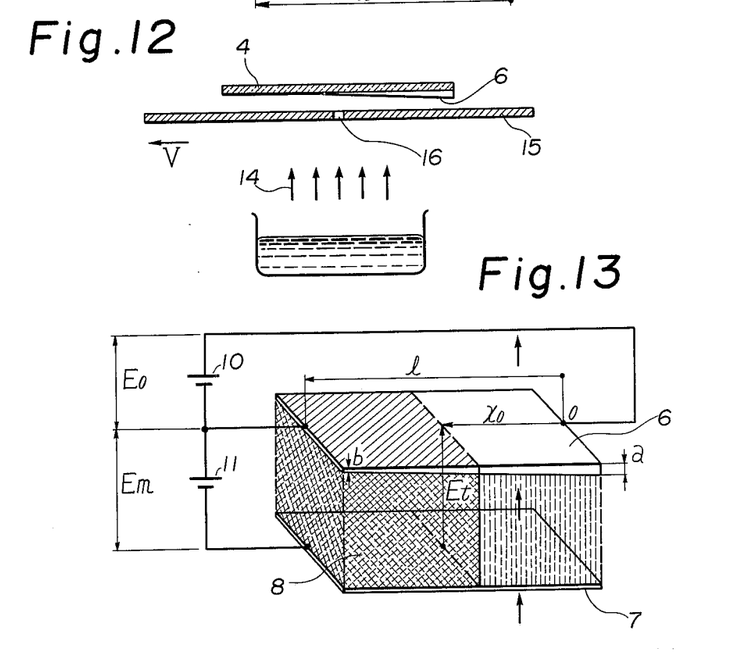
FIG. 12 is a diagram showing an example of the manufacturing method for the electric resistance film to be used in the embodiment shown in FIG. 8.
FIG. 13 is a diagram showing another example of electrical connection in the embodiment shown in FIG. 8.

A method for forming the electric resistance film varying in thickness as described above is determined as desired; for example, the evaporating time for forming the electric resistance film on the transparent plate 4 can be changed in accordance with the evaporating position. As shown in FIG. 12, the mask 15 which obstructs the evaporated material 14 is arranged on the surface of the transparent plate 4, this mask is provided with the window or slit 16, the evaporating time at each position varies and the thickness of the evaporated film also varies when the mask 15 is moved in the specified position along the transparent plate 4 for evaporation and the moving speed V is changed, and the electric resistance film varying in thickness can be formed on the transparent plate 4. Though the range of variation of the thickness is determined as desired, the thickness can generally be varied from approximately $1\mu$ to $60\mu$. For simplification of the description, the width W of the electrode 6 comprising the electric resistance film is to be fixed. On the other hand, the electrode 7 comprising the conductor film has the same or larger shape and dimensions as or than the electrode 6 comprising the electric resistance film and has the fixed thickness.

The constant voltage $E_o$ from the DC constant voltage power supply 10 and the DC measured voltage $Em$ are applied across the right extreme end of the electric resistance film or the zero point of the electrode 6 and the left extreme end of the electric resistance film or the point of $X = l$ of the electrode 6, and the left extreme ends of the electrode 6 comprising the electric resistance film and of the electrode 7 comprising the conductor film are shorted. Since the constant voltage $E_o$ and the measured voltage $Em$ are applied so that the side of $X = 0$ of the electrode 6 is positive, the negative voltage gradient from the point of $X = 0$ to the point of $X = l$ occurs with respect to the electrode 6 and the potential at each part of the electrode 7 is equal to the potential at the point of $X = l$ of the electrode 6.

Figure 11:
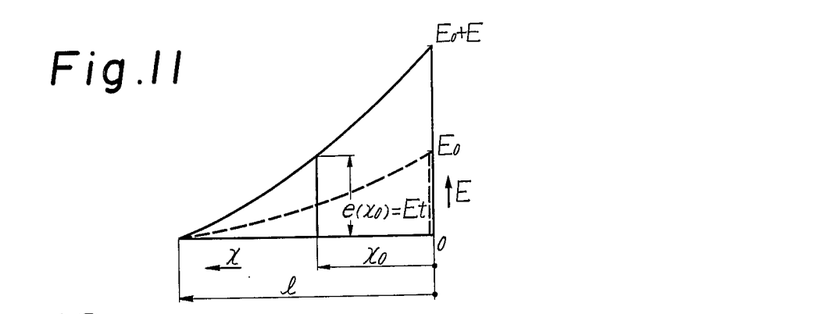
FIG. 11 is a view showing the distribution of voltage across the electrodes in the example of FIG. 10.

In the above configuration, the voltage applied across the electrodes 6 and 7 or the voltage applied to the liquid crystal 8 is the function $e(X)$ which varies with respect to X as described in the foregoing and therefore it is herein referred to as the voltage distribution $e(X)$. This voltage distribution $e(X)$ can be denoted as shown, for example, in FIG. 11 in accordance with variation of thickness $d$ of the electric resistance film, that is, $f(X)$. The dotted line shows the voltage distribution in case of $Em = 0$ and the solid line shows the voltage distribution when the measured voltage $Em$ is applied, that is, that in case of $Em \neq 0$.

If the resistivity of the electrode 6 is $\rho$, the width is W and the thickness is $d = f(X)$, the electric resistance $R_X$ of the electrode 6 from the position of $X = 0$ to the position $X_o$ where the voltage applied to the liquid crystal 8 is the threshold voltage of $Et$ is given by the following equation (11).

$$R_X = \int_0^{X_o} \frac{\rho}{W \cdot d} dX = \int_0^{X_o} \frac{\rho}{W} \cdot \frac{dX}{f(X)} \qquad (11)$$

The electric resistance $R_l$ of the electrode 6 from the position of $X = 0$ to the position of $X = l$ is given by the following equation (12).

$$R_l = \int_0^l \frac{\rho}{W \cdot d} dX = \int_0^l \frac{\rho}{W} \cdot \frac{dX}{f(X)} \qquad (12)$$

The voltage $e(X_o)$ at the coordinate point $X_o$ is given as follows:

$$e(X_o) = (1 - R_X/R_l)(E_o + Em) \qquad (13)$$

where, $e(X_o)$ is equal to the threshold voltage $Et$. The constant voltage $E_o$ is set to be equal to the threshold voltage $Et$.

$$e(X_o) = Et, \, Em = Et \qquad (14)$$

With this equation (14), the equation (13) is given as follows:

$$\frac{Em}{Et} = \left(\frac{R_x}{R_l}\right) / \left\{1 - \frac{R_x}{R_l}\right\} \quad (15)$$

The following equation is obtained by substituting the equations (11) and (12) in the equation (15).

$$1/(1 + \frac{Em}{Et}) = \int_0^{X_o} \frac{dX}{f(X)} / \int_0^l \frac{dX}{f(X)} \quad (16)$$

The relationship between the functional voltage which should be measured and the coordinate $X_o$ is given by the following equation.

$$X_o = F(Em/Et) \quad (17)$$

The following equation (18) is obtained by substituting this reverse function $Em/Et = F^{-1}(X_o)$ in the equation (16).

$$1/\{1 + F^{-1}(X_o)\} = \int_0^{X_o} \frac{dX}{f(X)} / \int_0^l \frac{dX}{f(X)} \quad (18)$$

The thickness function $f(X)$ of the electric resistance film forming the electrode 6 is obtained by solving the above integral equation. In other words, the variation of the thickness of the electric resistance film is set to indicate the functional voltage to be measured by the equally graduated scale.

On the other hand, when the variation of thickness of the electric resistance film forming the electrode 6 is predetermined or $f(X)$ is predetermined, the function of the measured voltage $Em$ which may be indicated on the equally graduated scale using the electric resistance film is clarified by substituting $f(X)$ in the equation (16). For example, assume a special case in which $f(X)$ is fixed or the thickness of the electric resistance film forming the electrode 6 is fixed regardless of the coordinate X. In this case, the following equation is obtained by substituting $f(X) = A$ (fixed) in the equation (16).

$$X_o = l/(1 + Et/Em) \quad (19)$$

When the measured voltage $Em$ is extremely large, that is, in case of $Em > Et$, $X_o = l$ is given, and when the left extreme end position is taken as the origin of coordinate $X_{os}$, the following equation is given.

$$X_{os} - X_o = l / \left\{1 + \frac{Em}{Et}\right\} \approx l \, Et/Em \quad (20)$$

Since the length $l$ and the threshold voltage $Et$ are the fixed values, the equation (20) indicates that the distance from the coordinate origin $X_{os}$ at the left extreme end of the electrode 6 to the border position $X_o$ which divides the bright part and the dark part is nearly proportional to the inverse number of the measured voltage $Em$. In other words, the function of the thickness of electric resistance film forming the electrode 6 is fixed, the inverse number of the measured voltage $Em$ can be indicated approximately on the equally graduated scale by the border position dividing the bright and dark parts. Since the equation (20) is obtained approximately from the assumption of $Em > Et$, the error on the equally graduated scale is large in the region in which $Em$ is small, that is, the border position dividing the bright and dark parts is located near the right extreme end of the electrode and therefore it is desirable to use mainly the left side part.

The following describes the indication of the decibel values of voltages on the equally graduated scale in the embodiment shown in FIGS. 8 to 10. In this case, $f(X)$ is set to be an exponential function as shown by the following equation (21). In other words, $f(X)$ is set so that the thickness of the electrode 6 varies in terms of the exponential function and the value of electric resistance per unit length of the electrode 6 varies in terms of the inverse number of the exponential function.

$$f(X) = A \exp(-\mu X) \quad (21)$$

where, $A$ and $\mu$ are the constants.

The equation (23) is obtained by defining the decibel of voltage $Em$ as shown by the equation (22) and substituting the equation (22) in the equation (15).

$$(Em) \, db = 20 \log_{10}(Em/Et) \quad (22)$$

Therefore $Em/Et = \exp\{(Em) \, db/20 \log e\} = \exp\{(Em) \, db/8.686\}$ \quad (23)

Substitution of the equations (23) and (21) into the equation (16) results in as follows:

$$\frac{1}{1 + e^{(Em) \, db/8.686}} = \frac{\int_0^{X_o} e^{\mu X} dX}{\int_0^l e^{\mu X} dX} = \frac{e^{\mu X_o} - 1}{e^{\mu l} - 1} \quad (24)$$

If the coordinate with $(Em)$ db $= 0$ i.e., $Em = Et$ is defined as $X_{os}$ and the equation (24) is obtained approximately around $X_{os}$, that is, $(Em)$ db $\approx 0$, the difference between $X_{os}$ and $X_o$ is as follows:

$$X_o - X_{os} = \frac{e^{\mu l} - 1}{20 \log e} (Em) \, db \quad (25)$$

It is known from the equation (25) that the distance from the position of zero decibel to the position $X_o$ dividing the bright and dark parts is proportional to $(Em)$ db. Accordingly, if the function of thickness of the electrode 6 is the exponential function, it is obvious that the decibel values of voltages can be indicated by the equally graduated scale. Since the border line dividing the bright and dark parts moves almost in proportion to the variation of the decibel value, this border line permits reading of the decibel values on the equally graduated scale.

FIG. 13 shows another embodiment of the functional voltmeter in accordance with the present invention. In this embodiment, the constant voltage $E_o$ is applied across both ends of the electric resistance film 6 and the measured voltage $Em$ is applied across the low voltage terminal of the electric resistance film 6 and the completely conductive film 7. Other elements are the same as shown in FIGS. 8 to 10. In this case, the voltage distribution can be indicated as shown in FIG. 14, and the condition of $Em < Et$ is necessary.

Figure 14:
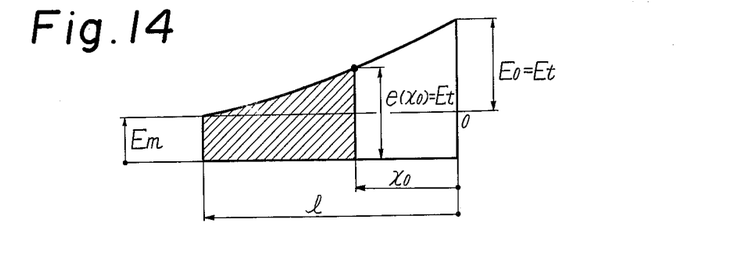
FIG. 14 is a view showing the distribution of voltage across the electrodes in the embodiment shown in FIG. 13.

In FIG. 14, the voltage $e(X_o)$ at the coordinate point $X_o$ is given below as described in the foregoing.

$$e(X_o) = Em + (1 - R_X/Rl) E_o \qquad (26)$$

If $e(X_o) = Et$ is given on the assumption that the position $X_o$ is the border position dividing the bright and dark parts and the constant voltage $E_o$ is set to be equal to the threshold voltage $Et$, the following equation (27) is obtained by substituting the equations (11) and (12) in the equation (26).

$$\frac{Em}{Et} = \frac{\int_0^{X_o} \frac{dX}{f(X)}}{\int_0^l \frac{dX}{f(X)}} \qquad (27)$$

When the electrode 6 comprising the electric resistance film is formed trapezoidally as shown in FIG. 13 so that the thickness of the right extreme end is $a$ and that of the left extreme end is $b$, the following equation is obtained from the equation (27) and the equation (29) is derived.

$$\frac{Em}{Et} = \frac{\int_0^{X_o} \left( a - \frac{a-b}{l} X \right)^{-1} dX}{a - \frac{a-b}{l} X^{-1} dX} = \frac{\log_e\left(1 - (1 - \frac{b}{a})\frac{X_o}{l}\right)}{\log_e(\frac{b}{a})} \qquad (28)$$

$$X_o = l \frac{a}{a-b} \left( 1 - \exp\left( -\frac{\log_e(a/b)}{Et} \cdot Em \right) \right) \qquad (29)$$

This equation indicates that the indicial response equation for the primary feedback control which causes convergence to $X_o = 0$ at $Em = 0$ and to $X_o = l$ at $Em = Et$ can be indicated by the equally graduated scale.

Figure 15:
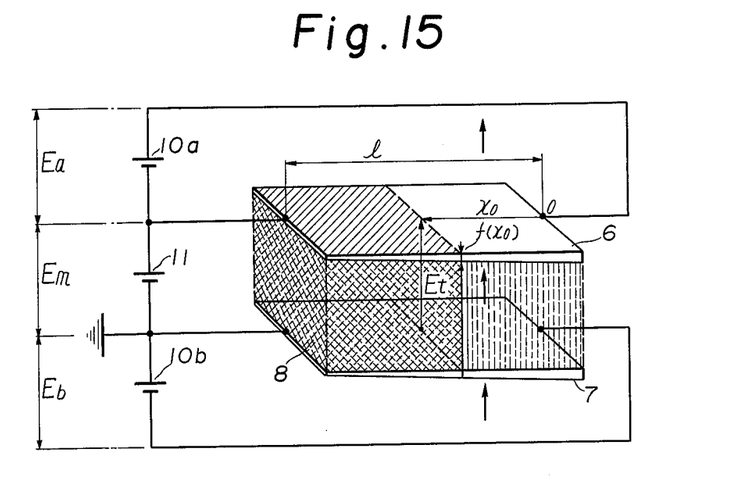
FIG. 15 is a diagram showing the electrical connection in the embodiment which is set so that both the electrodes comprise the electric resistance film and the thickness of both the electrodes varies.
Figures 16, 17:
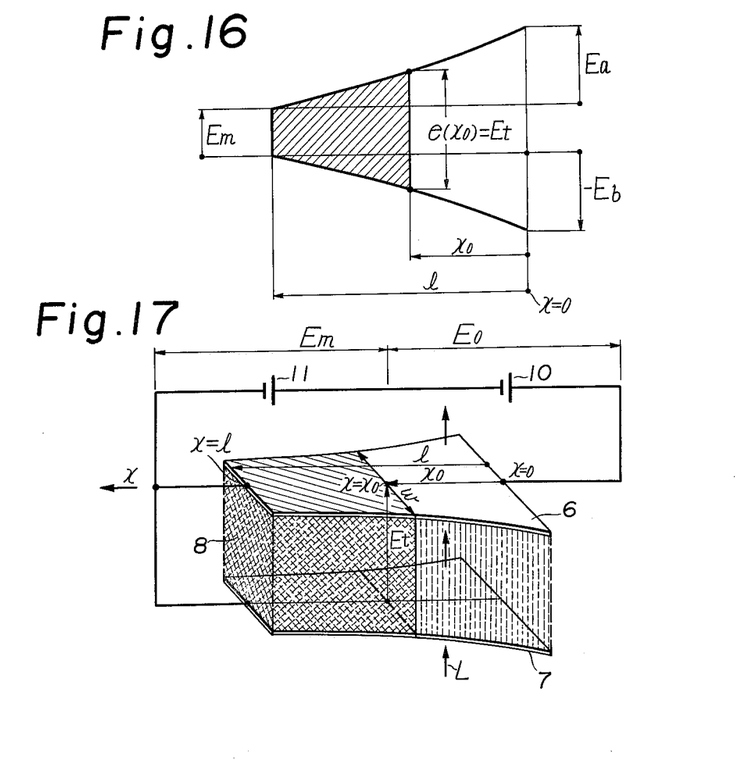
FIG. 16 is a view showing the distribution of voltage across both the electrodes in the example shown in FIG. 15.
FIG. 17 is a sketch showing the embodiment which is set so that the width of the electric resistance film varies.

FIG. 15 shows another embodiment of the functional voltmeter in accordance with the present invention. In this embodiment, both electrodes 6 and 7 enclosing the liquid crystal 8 comprise the electric resistance film so that the thickness of both the electrodes varies in accordance with the same function. The first constant voltage $Ea$ of the first constant voltage power supply 10a is applied across both ends of the electrode 6 and the second constant voltage $Eb$ of the second constant voltage power supply 10b is applied to both ends of the electrode 7 and the measured voltage $Em$ is applied across the low voltage terminals of the electrodes 6 and 7. In this case, both constant voltages $Ea$ and $Eb$ are set to be in the same direction of the voltage gradient. The distribution of voltage applied to the liquid crystal is as shown in FIG. 16. If the resistivities of the electric resistance films forming the electrodes 6 and 7 are equal and the threshold voltage is $Et = Ea + Eb$, the following equation (30) is given.

$$\frac{Em}{Et} = \frac{\int_0^{X_o} \frac{dX}{f(X)}}{\int_0^l \frac{dX}{f(X)}} \qquad (30)$$

Since this equation is equal to the equation (27) in the example shown in FIG. 13, the embodiment can be considered completely similarly to the example in FIG. 13.

In the above-mentioned embodiments, the width W of the electrode 6 comprising the electric resistance film is fixed. The width W can be determined so that it varies in accordance with the function $g(X)$ of X as shown in FIG. 16 and the thickness $d$ is fixed. In this case, the electrode 7 comprising the conductor film is made in the same shape and dimensions as the electrode 6 or in a larger shape than the electrode 6.

The following equation (31) can substitute for the equation (11).

$$R_X = \int_0^{X_o} \frac{\rho}{d} \cdot \frac{dX}{g(X)} \qquad (31)$$

Also, the following equation (32) can substitute for the equation (12).

$$R_l = \int_0^l \frac{\rho}{d} \cdot \frac{dX}{g(X)} \qquad (32)$$

In this case, a desired functional voltage such as, for example, the decibel value of voltage can be indicated on the equally graduated scale by approximately setting the function $g(X)$ of the width as described in the foregoing. The electrical connection shown in FIG. 16 is similar to that in FIG. 10. When the width W is varied, the electrode can be connected as shown in FIG. 13 and both electrodes 6 and 7 can comprise the electric resistance film similarly to FIG. 15.

Moreover, both the width W and thickness $d$ of electrode 6 (or electrodes 6 and 7) comprising the electric resistance film can be determined to vary in accordance with X. If $d = f(X)$ and $W = g(X)$ are given, the following equation (33) can substitute for the equation (11).

$$R_X = \int_0^{X_o} \frac{\rho}{f(X) \cdot g(X)} dX \qquad (33)$$

Also the following equation (34) can substitute for the equation (12).

$$R_l = \int_0^l \frac{\rho}{f(X) \cdot g(X)} dX \qquad (34)$$

In this case, a desired functional voltage can be indicated on the equally graduated scale as same as in the foregoing description by appropriately setting the composite function $F(X) = f(X) \cdot g(X)$ of the thickness function and the width function.

In the embodiments described in the foregoing, the transparent plates 4 and 5 can be omitted when the electrodes 6 and 7 are provided directly on the polaroidal plates 1 and 2.

The voltmeter of the present invention which do not have mechanically moving parts such as the moving coil is advantageous in that there is no error of measurement resulting from external mechanical vibration and high vibration resistance and high response are provided. Furthermore, the voltmeter is also advantageous in that it can indicate substantially the functional voltages such as the logarithmic values, that is, the decibel values of voltages on the equally graduated scale and it is therefore easy to read the functional voltage.

What is claimed is:

1. A decibel meter comprising:
   (a) a pair of polaroidal plates disposed in parallel opposed position, said polaroidal plates being arranged so that their polarizing directions intersect at a right angle, (b) a pair of light-transmitting electrodes disposed in spaced parallel relationship between said polaroidal plates, one of said electrodes comprising an electrical resistance film, the other of said electrodes comprising a conductor film, one end of said electric resistance film being electrically connected to one end of said conductor film, (c) a nematic liquid crystal, adapted to produce a DAP effect, filling a space defined between said electrodes (d) a scale indicating means on one of said polaroidal plates on a surface thereof which is remote from said liquid crystal, said scale means having graduations at substantially equal intervals (e) a constant voltage power supply electrically connected to said one electrode comprising said electrical resistance film for applying a constant voltage to thereto such that a voltage gradient occurs from one end to the other of said electrode, the resistance value per unit length of said resistance film from one end to the other of said film varying as the inverse of an exponential function, said constant voltage and a voltage to be measured being applied in series across the two ends of said electrical resistance film.

2. A decibel meter in accordance with claim 1, further comprising a light source for irradiating a light to said other polaroidal plate.

3. A decibel meter in accordance with claim 1, wherein the thickness of said electric resistance film varies with an exponential function from one end to the other end of the electric resistance film.

4. A decibel meter in accordance with claim 1, wherein the width of said electric resistance film varies with an exponential function from one end to the other end of the electric resistance film.

* * * * *